(12) United States Patent
Hamano et al.

(10) Patent No.: US 8,569,106 B2
(45) Date of Patent: Oct. 29, 2013

(54) METHOD FOR MANUFACTURING SILICON CARBIDE SEMICONDUCTOR DEVICE

(75) Inventors: Kenichi Hamano, Tokyo (JP); Kenichi Ohtsuka, Tokyo (JP); Nobuyuki Tomita, Tokyo (JP); Masayoshi Tarutani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/148,537

(22) PCT Filed: Feb. 15, 2010

(86) PCT No.: PCT/JP2010/052153
§ 371 (c)(1),
(2), (4) Date: Aug. 9, 2011

(87) PCT Pub. No.: WO2010/101016
PCT Pub. Date: Sep. 10, 2010

(65) Prior Publication Data
US 2011/0312161 A1    Dec. 22, 2011

(30) Foreign Application Priority Data
Mar. 5, 2009   (JP) .................................. 2009-051551

(51) Int. Cl.
*H01L 21/00*   (2006.01)

(52) U.S. Cl.
USPC .............. 438/105; 438/931; 257/77; 257/628

(58) Field of Classification Search
CPC .................................................. H01L 29/1608
USPC .................... 438/105, 931; 257/76, 77, 628, 257/E21.054, E21.699
See application file for complete search history.

(56) References Cited

U.S. PATENT DOCUMENTS

2005/0205872 A1*  9/2005  Hallin et al. .................... 257/77

FOREIGN PATENT DOCUMENTS

| CN | 1374683 A | 10/2002 |
|---|---|---|
| CN | 1799123 A | 7/2006 |

(Continued)

OTHER PUBLICATIONS

International Preliminary Report on Patentability and Written Opinion issued Sep. 15, 2011, in PCT/JP2010/052153 with English translation, (Sep. 15, 2011).

(Continued)

*Primary Examiner* — Khiem D Nguyen
(74) *Attorney, Agent, or Firm* — Oblon, Spivak, McClelland, Maier & Neustadt, L.L.P.

(57) ABSTRACT

A film of an epitaxial layer that allows the reduction in both the height of a bunching step and crystal defects caused by a failure in migration of reactive species on a terrace is formed on a SiC semiconductor substrate having an off angle of 5 degrees or less. A film of a first-layer epitaxial layer is formed on and in contact with a surface of the SiC semiconductor substrate having an off angle of 5 degrees or less. Subsequently, the temperature in a reactor is lowered. A second-layer epitaxial layer is caused to epitaxially grow on and in contact with a surface of the first-layer epitaxial layer. In the above-described manner, the epitaxial layer is structured with two layers, and the growth temperature for the second epitaxial layer is set lower than the growth temperature for the first epitaxial layer.

8 Claims, 11 Drawing Sheets

(56) References Cited

FOREIGN PATENT DOCUMENTS

| | | | |
|---|---|---|---|
| EP | 2 196 565 B1 * | 6/2012 | |
| JP | 06-267868 | 9/1994 | |
| JP | 10-256666 | 9/1998 | |
| JP | 2005-32823 | 2/2005 | |
| JP | 2006-120897 | 5/2006 | |
| JP | 2008-222509 | 9/2008 | |
| JP | 2008-250296 | 10/2008 | |
| JP | 2008-277844 | 11/2008 | |
| WO | WO 2008/056698 A1 | 5/2008 | |
| WO | WO 2008/062729 A1 | 5/2008 | |
| WO | WO 2009/013914 A1 | 1/2009 | |

OTHER PUBLICATIONS

International Search Report Issued May 11, 2010, in PCT/JP2010/052153, (May 11, 2010).

A. Shrivastava, et al., "Study of triangular defects and inverted pyramids in 4H-SiC 4° off-cut (0001) Si face epilayers", Journal of Crystal Growth, vol. 310, 2008, pp. 4443-4450, (2008).

M. Syväjärvi, et al., "Step-bunching in SiC epitaxy: anisotropy and influence of growth temperature", Journal of Crystal Growth, vol. 236, 2002, pp. 297-304, (2002).

Korean Office Action Issued Nov. 14, 2012 in Patent Application No. 10-2011-7020499 (with English translation), (Nov. 14, 2012).

Korean Office Action for Korean Application No. 10-2011-7020499 dated May 23, 2013, and English translation of relevant portions thereof.

Office Action mailed Jun. 25, 2013 in Japanese Patent Application No. 2011-502705.

Office Action mailed May 6, 2013, in Chinese Patent Application No. 201080010581.7 (With Partial English Translation).

Japanese Office Action dated Aug. 20, 2013 for Japanese Patent Application No. 2011-502705.

* cited by examiner

F I G. 3
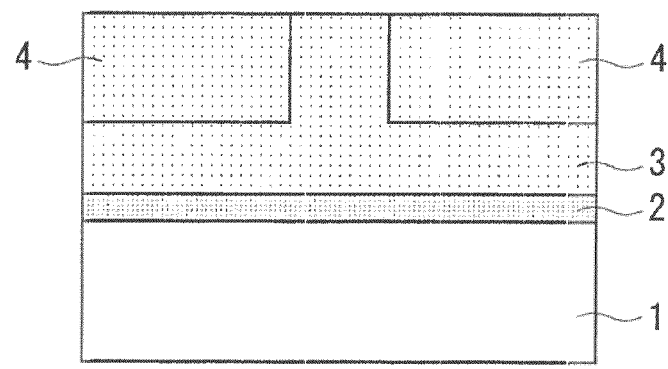
F I G. 4
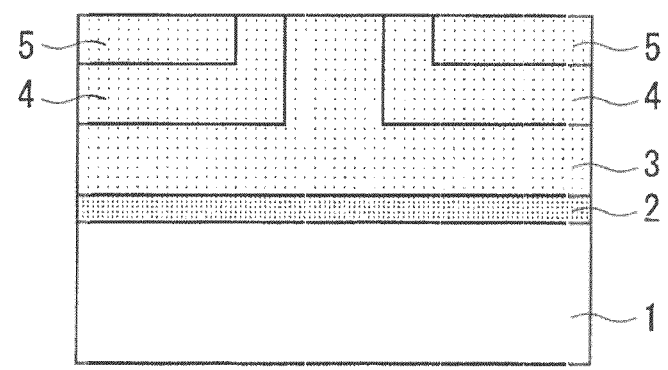

F I G. 5
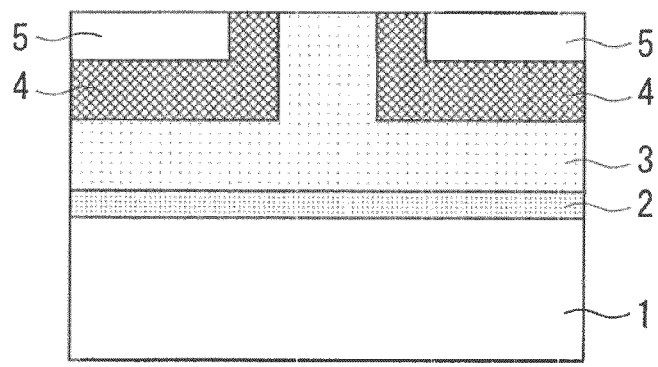
F I G. 6
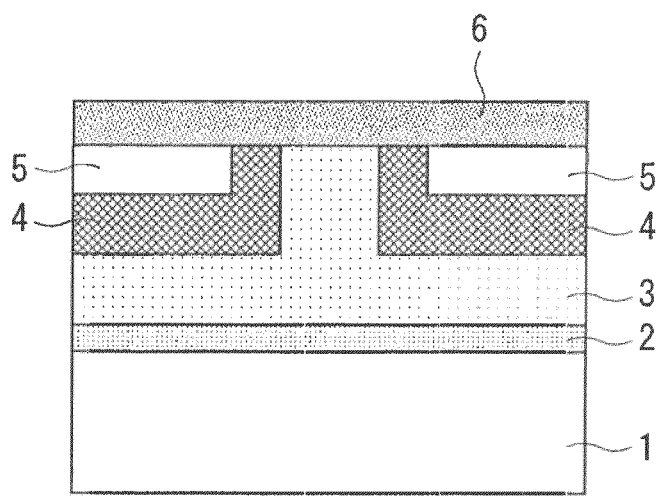

F I G . 1 3
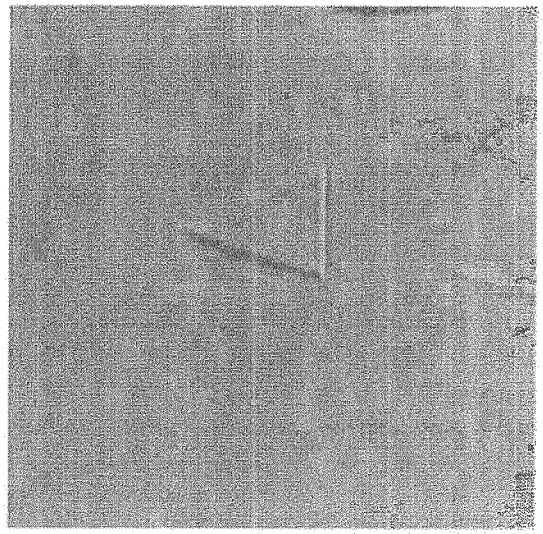

F I G . 1 8
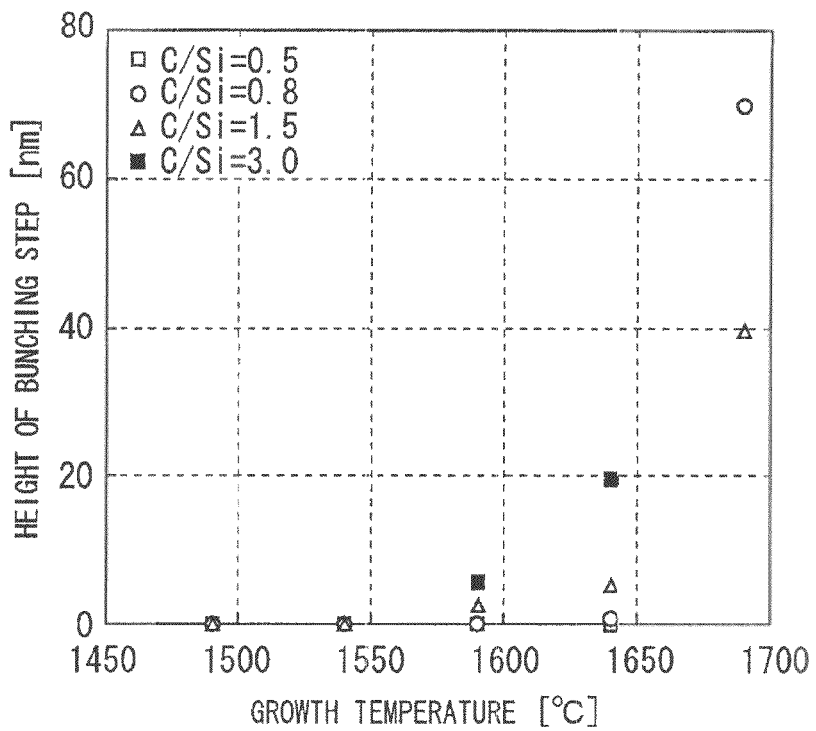
F I G . 1 9
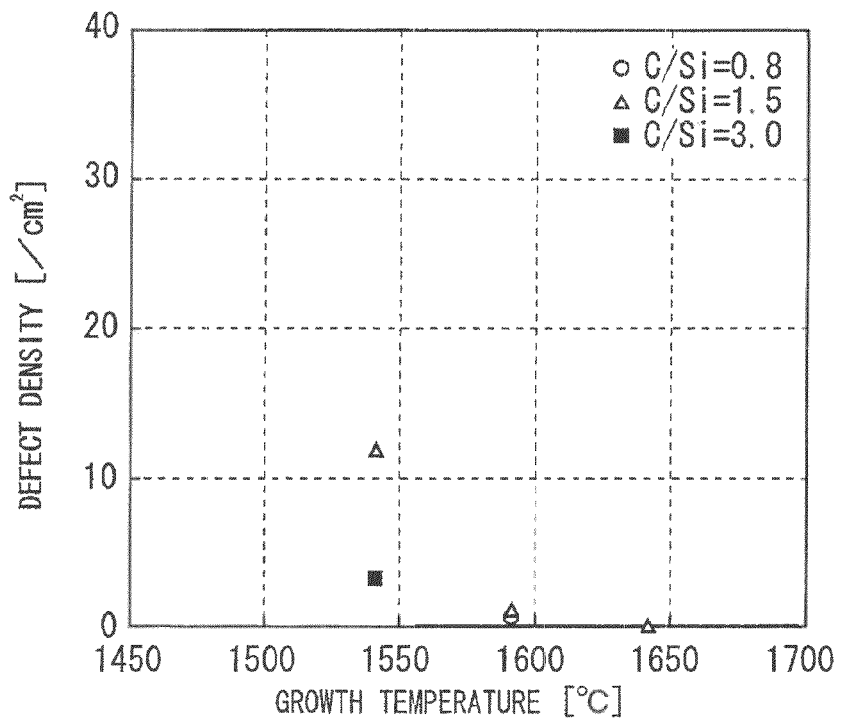

METHOD FOR MANUFACTURING SILICON CARBIDE SEMICONDUCTOR DEVICE

TECHNICAL FIELD

The present invention relates to a method for manufacturing a silicon carbide (hereinafter referred to as "SiC") semiconductor device.

BACKGROUND ART

In order to form a SiC semiconductor device, it is necessary that an epitaxial layer serving as an active region of a semiconductor element is caused to grow on a SiC substrate. The epitaxial layer is formed through step-flow growth. A crystal surface of the SiC substrate has a fine unevenness, and an uneven portion is called a "step" while a surface having no uneven portion is called a "terrace". In the step-flow growth, a wafer is inclined so that reactive species adhering to the crystal surface diffuse over the terrace, and the reactive species are sequentially incorporated from the one having reached the step. Thus, a flat surface morphology is obtained. Generally, the inclination of the wafer is formed in the [11-20] direction from a (0001) plane. An angle of the inclination is called an "off angle". Currently, the general off angle is 8 degrees in a case of a 4H-SiC substrate, and 3.5 degrees in a case of a 6H-SiC.

Patent Document 1 proposes to cause an epitaxial growth on a 4H-SiC substrate having an off angle of 8 degrees from a (0001) plane of the substrate in the [11-20] direction, to thereby form an epitaxial layer on which an epitaxial growth is further caused at a raised growth temperature, thus reducing the Basal Plane Dislocation density that is taken over from the SiC substrate.

PRIOR-ART DOCUMENTS

Patent Documents

Patent Document 1: Japanese Patent Application Laid-Open No. 2006-120897

SUMMARY OF INVENTION

Problems to be Solved by the Invention

Here, in recent years, a lower off angle is aimed at in terms of manufacturing costs of a SiC substrate, and it is desired to use a SiC substrate having an off angle of 4 degrees or less. Additionally, considering a process margin of the SiC substrate and a distribution of the off angle in a plane of the substrate, it is necessary to assume a SiC substrate having an off angle of 5 degrees or less. Moreover, in commercially available SiC substrates, even a just-plane substrate having an off angle of 0 degrees does not have a complete (0001) plane and has a slight off angle, because of a difficulty in the processibility.

From the viewpoint described above, the need arises for performing an epitaxial growth on a wafer of a SiC substrate having an off angle of 5 degrees or less relative to the just-plane substrate.

As the off angle of the substrate decreases, the terrace width increases to raise the possibility of occurrence of two-dimensional nucleation originating from a nucleus formed by reactive species not reaching a step but staying on a terrace. Particularly when the growth temperature for an epitaxial layer is low, a length of a migration of the reactive species on the terrace is shortened, which makes it easy that crystal defects are caused by a failure in the migration of the reactive species on a terrace surface.

Additionally, because of a surface energy, as the off angle of the substrate decreases, a surface roughness called a "bunching step" is easier to occur. Particularly when the growth temperature for the epitaxial layer is high, the occurrence of the bunching step is significantly observed.

In a case where a SiC epitaxial layer is caused to grow on a SiC substrate having a low off angle of 5 degrees or less, a decrease in the off angle causes a considerable increase in the terrace width relative to the length of the migration of the reactive species. Therefore, the reactive species are likely to stay on the terrace and form a nucleus, to raise the possibility of occurrence of crystal defects originating from the nucleus. Particularly, these crystal defects are more likely to occur in an initial state of the growth at a portion near an interface between a substrate and an epitaxial layer formed thereon, than during the growth.

It is considered that an effective method for reducing the above-described crystal defects is raising the growth temperature to increase the length of the migration of the reactive species.

However, there is a problem that if an epitaxial layer having a thickness of several μm or more is caused to grow under the condition of a relative high growth temperature, a large bunching step occurs to roughen a surface.

The present invention has been made to solve the above-described problems newly recognized in a SiC substrate having an off angle of 5 degrees or less, and a main object of the present invention is to obtain a method for manufacturing a silicon carbide semiconductor device that includes an epitaxial layer in which both bunching steps and crystal defects originating from a migration failure are reduced, or that can allow an expansion of a process margin (also called a process window) of the epitaxial layer.

Means for Solving the Problems

A method for manufacturing a silicon carbide semiconductor device according to a subject matter of the present invention includes the steps of: causing a first epitaxial layer to grow on a main surface of a silicon carbide semiconductor substrate having an off angle; and causing a second epitaxial layer to grow on and in contact with an upper surface of the first epitaxial layer at a growth temperature lower than a growth temperature for the first epitaxial layer.

Effects of the Invention

In the subject matter of the present invention, an epitaxial film in which crystal defects originating from a failure in a migration of reactive species are reduced while suppressing occurrence of a bunching step can be formed on a SiC substrate having an off angle. That is, the first epitaxial layer is caused to epitaxially grow at a high temperature to thereby suppress the crystal defects, and the second epitaxial layer is caused to grow at a temperature lower than the growth temperature for the first epitaxial layer to thereby reduce the height of the bunching step. This enables reduction in both the height of the bunching step and the density of crystal defects originating from the migration failure.

These and other objects, features, aspects and advantages of the present invention will become more apparent from the following detailed description when taken in conjunction with the accompanying drawings.

BRIEF DESCRIPTION OF THE DRAWINGS

FIG. 3 is a vertical cross-sectional view showing the method for manufacturing the vertical n-channel SiC-MOSFET according to this embodiment.

FIG. 4 is a vertical cross-sectional view showing the method for manufacturing the vertical n-channel SiC-MOSFET according to this embodiment.

FIG. 5 is a vertical cross-sectional view showing the method for manufacturing the vertical n-channel SiC-MOSFET according to this embodiment.

FIG. 6 is a vertical cross-sectional view showing the method for manufacturing the vertical n-channel SiC-MOSFET according to this embodiment.

FIG. 13 is a diagram showing an observed crystal defect resulting from a migration failure.

FIG. 18 is a diagram showing a relationship between a growth temperature for an epitaxial layer and the height of a bunching step.

FIG. 19 is a diagram showing a relationship between the growth temperature for the epitaxial layer and the density of crystal defects caused by a migration failure.

EMBODIMENT FOR CARRYING OUT THE INVENTION (Embodiment 1)

A method for manufacturing a SiC semiconductor device according to this embodiment is characterized in that, for preparing a drift layer of a SiC semiconductor element (such as a vertical MOSFET or IGBT), a first layer epitaxial film (first drift layer) is caused to grow to form a first drift layer on which then a second layer epitaxial film (second drift layer) is caused to grow at a temperature lower than a growth temperature for the first layer epitaxial film, to thereby form the drift layer.

Figure 1:
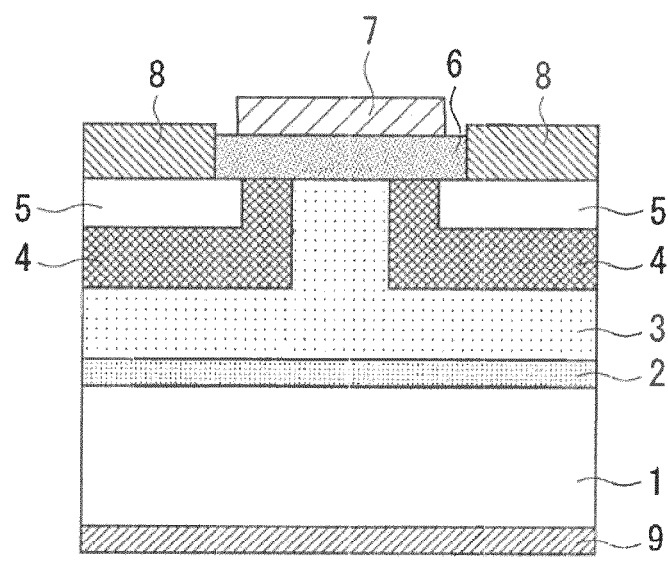
FIG. 1 is a vertical cross-sectional view showing a structure of a vertical n-channel SiC-MOSFET, as an example of a semiconductor element structure of a SiC semiconductor device manufactured by a method for manufacturing a SiC semiconductor device according to an embodiment 1.

The vertical cross-sectional view of FIG. 1 shows a vertical n-channel SiC-MOSFET as an example of a semiconductor element structure of a SiC semiconductor device manufactured by the method for manufacturing the SiC semiconductor device according to this embodiment. In FIG. 1, the reference numerals denote the following constituent elements. The reference numeral 1 denotes an n-type (corresponding to a first conductivity type) SiC substrate having an off angle of 5 degrees or less (for example, an off angle of 4 degrees); the reference numeral 2 denotes a first drift layer (first epitaxial layer) of n-type SiC that is an epitaxial growth layer; the reference numeral 3 denotes a second drift layer (second epitaxial layer) of n-type SiC obtained as a result of causing an epitaxial growth at a growth temperature lower than a growth temperature for the growth of the first drift layer 2; reference numeral 4 denotes a p-type (corresponding to a second conductivity type) base region (well region); the reference numeral 5 denotes an n-type source region; the reference numeral 6 denotes a gate insulating film; the reference numeral 7 denotes a gate electrode; the reference numeral 8 denotes a source electrode; and the reference numeral 9 denotes a drain electrode. Thus, in the vertical n-channel SiC-MOSFET shown in FIG. 1, a drift layer includes two layers of the first and second drift layers 2 and 3.

FIGS. 2 to 9 are vertical cross-sectional views showing the method for manufacturing the SiC semiconductor device according to this embodiment, and more specifically showing a method for manufacturing the vertical n-channel SiC-MOSFET. In the following, the method for manufacturing the SiC semiconductor device according to this embodiment will be described with reference to FIGS. 2 to 9.

Figure 2:
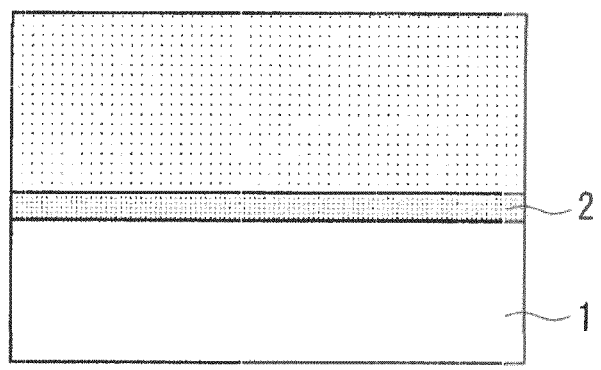
FIG. 2 is a vertical cross-sectional view showing the method for manufacturing a vertical n-channel SiC-MOSFET according to this embodiment.

Firstly, as shown in FIG. 2, (1) through an epitaxial crystal growth process, the first drift layer 2 of n-type SiC is formed as a first-layer epitaxial film on a main surface or an upper surface of the n-type SiC substrate 1 having an off angle of 5 degrees or less (for example, the off angle is set to 4 degrees), and additionally, (2) through an epitaxial crystal growth process performed at a growth temperature lower than the growth temperature for the growth of the first drift layer 2, the second drift layer 3 is formed as a second-layer epitaxial film on an upper surface of the first drift layer 2 and in contact with the upper surface of the first drift layer 2 (FIG. 2). Since the sequence of epitaxial crystal growth processes is the essence of this embodiment, a detailed description thereof will be given later.

After the epitaxial crystal growth, a mask (not shown) formed of a resist or the like is provided on portions of the second drift layer 3 spaced from one another at predetermined intervals, and then impurity is ion-implanted to form a pair of p-type base regions 4. FIG. 3 shows a vertical cross-sectional structure of an element after the mask is removed. Examples of the impurity that causes a p-type conductivity in the second drift layer 3 include boron (B) and aluminum (Al).

Moreover, a mask (not shown) formed of a resist or the like is provided in each of the p-type base regions 4, and then impurity is ion-implanted to form an n-type source region 5. FIG. 4 shows a vertical cross-sectional structure of the element after the mask is removed. Examples of the n-type impurity include phosphorus (P) and nitrogen (N).

Subsequent to the ion implantation, a wafer is subjected to a heat treatment under a high temperature by using a heat treatment apparatus (not shown), and thereby the implanted ions of n-type and p-type are electrically activated. FIG. 5 shows a vertical cross-sectional structure of the element obtained after the heat treatment.

Figure 7:
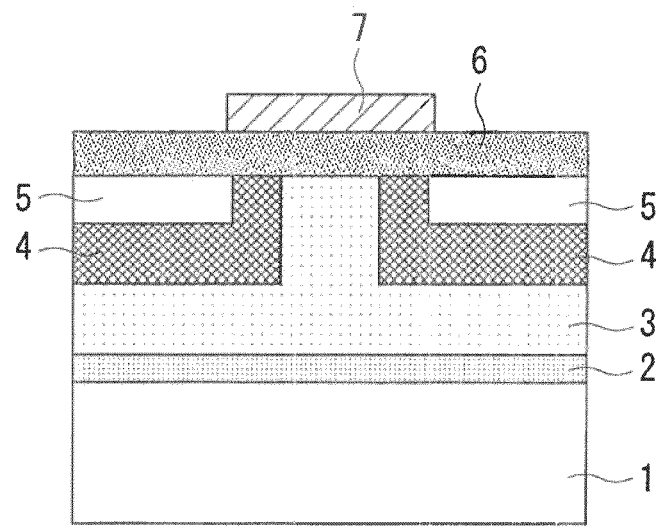
FIG. 7 is a vertical cross-sectional view showing the method for manufacturing the vertical n-channel SiC-MOSFET according to this embodiment.

Then, as shown in FIG. 6, the gate insulating film 6 is formed through thermal oxidation or deposition. A film of the gate electrode 7 is formed on the gate insulating film 6 and then, as shown in FIG. 7, the gate electrode 7 is patterned. The gate electrode 7 is patterned into such a shape that the pair of base regions 4 and the pair of source regions 5 can be positioned below both end portions of the electrode 7 and a part of the second drift layer 3 positioned between the pair of base regions 4 can be positioned immediately under the center of the electrode 7.

Figure 8:
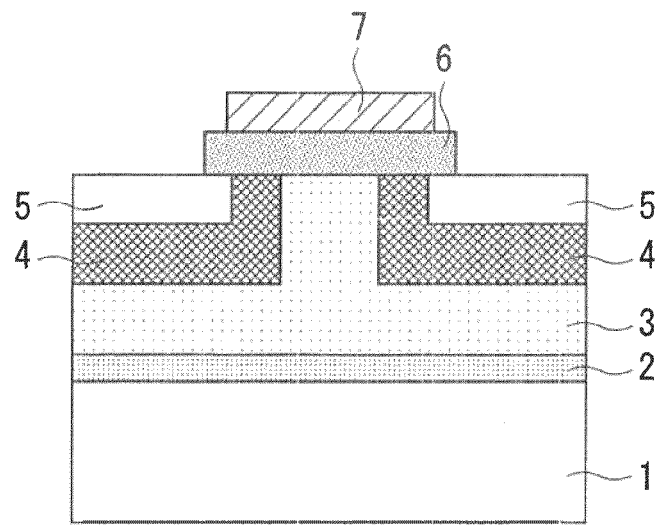
FIG. 8 is a vertical cross-sectional view showing the method for manufacturing the vertical n-channel SiC-MOSFET according to this embodiment.
Figure 9:
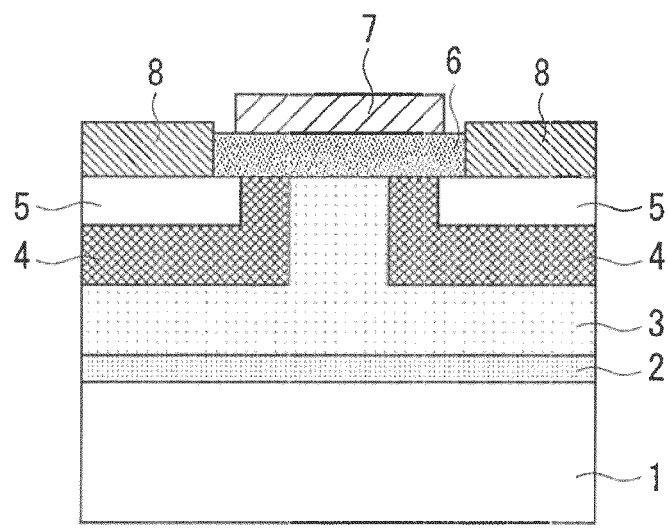
FIG. 9 is a vertical cross-sectional view showing the method for manufacturing the vertical n-channel SiC-MOSFET according to this embodiment.

Furthermore, a portion of the gate insulating film 6 left on each source region 5 is removed by a photolithography technique and an etching technique (FIG. 8). After the removal, a film of the source electrode 8 is formed on an exposed portion of the source region 5, and patterned (FIG. 9). Then, the drain electrode 9 is formed at the back surface side of the SiC substrate 1. Thereby, the main part of the element structure as shown in FIG. 1 is completed.

Next, a detailed description will be given of the steps of preparing the first and second drift layers 2 and 3 which are the characteristic feature of the method for manufacturing the SiC semiconductor device according to this embodiment.

Figure 10:
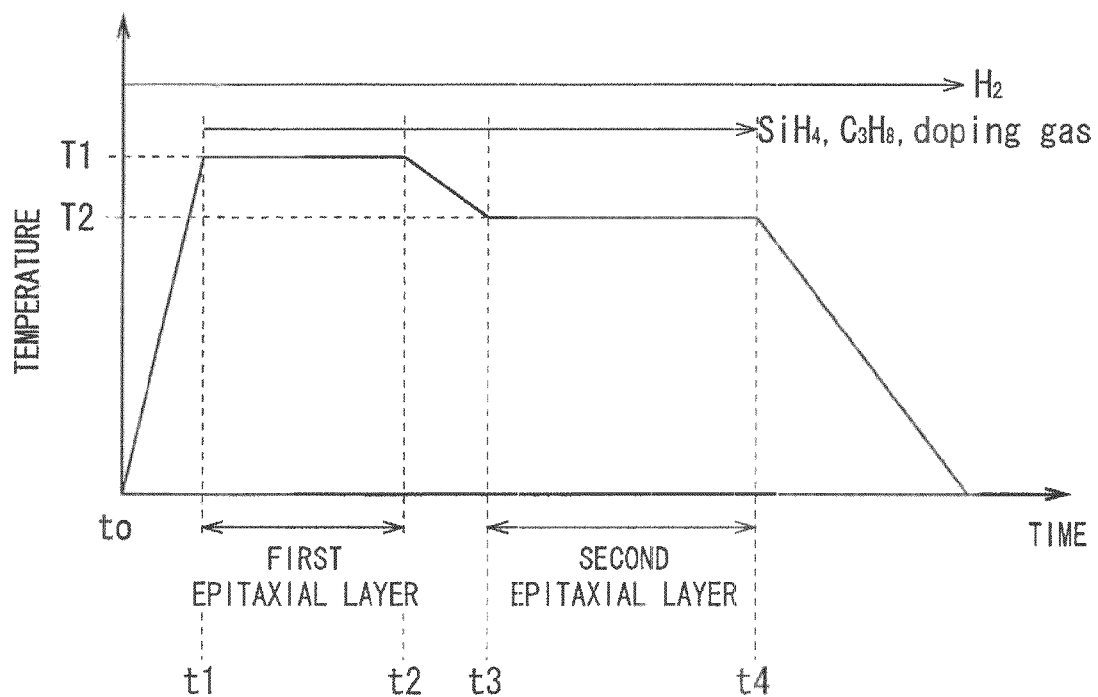
FIG. 10 is a diagram showing a temperature profile in a reactor until a first drift layer and a second drift layer shown in FIG. 1 are prepared.

FIG. 10 is a diagram showing a temperature profile in a reactor until the first drift layer 2 and the second drift layer 3 shown in FIG. 1 are prepared. In FIG. 10, the horizontal axis represents the time elapsed, and the vertical axis represents the temperature in the reactor. Hereinafter, the sequence of film formation steps will be described with reference to FIG. 10 and using the reference numerals shown in FIG. 1.

Firstly, at a time point t0, a carrier gas ($H_2$) is flowed in the reactor, and a temperature rise is started. Then, from a time point t1 at which the temperature in the reactor reaches a first growth temperature T1, a silane ($SiH_4$) gas, a propane ($C_3H_8$) gas, and a nitrogen ($N_2$) gas are introduced into the reactor, to start an epitaxial growth. The first epitaxial layer 2 is caused to grow until a time point t2 that comes after a predetermined time period has elapsed from the time point t1. Then, the temperature in the reactor is lowered to a growth temperature T2 (<T1) for the growth of the second epitaxial layer 3. Then, an epitaxial growth of the second epitaxial layer 3 is performed in a predetermined time period from the time point t3 at which the temperature in the reactor is lowered to the growth temperature T2 to a time point t4. Then, at the time point t4 coming after the predetermined time period has elapsed, the temperature in the reactor is lowered.

Prior to starting the growth of each of the first and second drift layers 2 and 3, a gas etching may be performed using, for example, a $H_2$ gas, a HCl gas, or a mixed gas thereof, for the purpose of removing a damaged layer of the SiC substrate 1.

Figure 11:
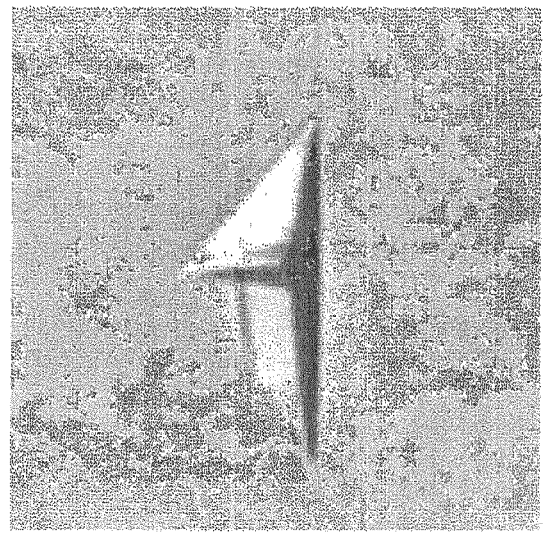
FIG. 11 is a diagram showing an observed crystal defect resulting from a migration failure.
Figure 12:
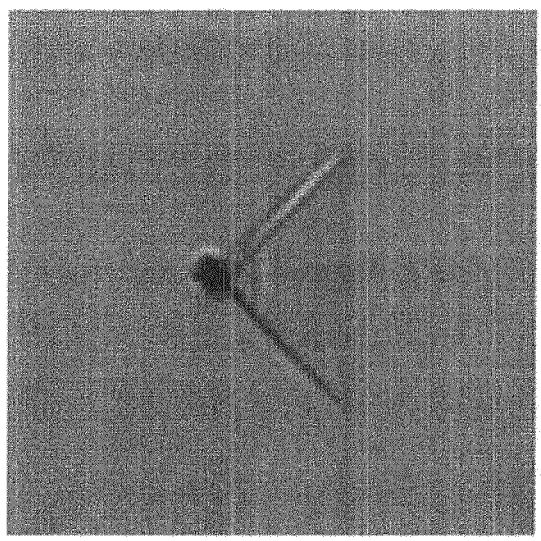
FIG. 12 is a diagram showing an observed crystal defect resulting from a migration failure.

FIGS. 11 to 13 show typical ones (observed results) of crystal defects resulting from a migration failure. Any of the crystal defects shown in FIGS. 11 to 13 has a triangular shape in a plan view. The crystal defect shown in FIG. 11 has a recess with a depth of several tens to several hundreds of nm. A part of the crystal defect shown in FIG. 12 has a recess in the depth direction. In the crystal defect shown in FIG. 13, the whole of the triangular shape thereof is recessed with a depth of several tens of nm.

The crystal defects resulting from a migration failure as shown in FIGS. 11 to 13 are often observed at an interface between an upper surface (main surface) of a SiC substrate having an off angle of 5 degrees or less and an epitaxial film formed thereon through an epitaxial growth. Therefore, the crystal defect density largely depends on film formation conditions under which the first-layer epitaxial film is formed. For example, the crystal defect density obtained when the first-layer epitaxial film is caused to grow at a growth temperature of 1600° C. and then a second-layer epitaxial film is caused to grow at a growth temperature of 1550° C. is approximately 1/10 of the crystal defect density obtained when the epitaxial films are caused to grow consistently at a growth temperature of 1550° C. Regarding the height of a bunching step, when the two layers of the epitaxial films are caused to grow under the above-mentioned growth temperature conditions, the height of the bunching step is suppressed to approximately 1/2 of the height obtained when the epitaxial films are caused to grow consistently at a growth temperature of 1600° C. However, the foregoing example applies when the first-layer epitaxial film having a thickness of approximately 0.5 µm is laminated on the main surface of the SiC substrate having an off angle of 5 degrees or less. On the other hand, when the first-layer epitaxial film has a thickness of approximately 0.2 µm, the height of the bunching step is nearly equal to the height obtained when the first-layer epitaxial film having a thickness of approximately 0.5 µm is laminated on the main surface of the SiC substrate, but the crystal defect density is merely approximately 1/3 of the crystal defect density obtained when the epitaxial growth is performed consistently at a growth temperature of 1550° C. Nevertheless, even in a case where the film thickness of the first-layer epitaxial film is smaller than about 0.5 µm, the effect of reduction in the crystal defect density is obtained. In a case where the first-layer epitaxial film has a large film thickness, the crystal defect density is sufficiently reduced, but it can be considered that, particularly when the film thickness of the first-layer epitaxial film exceeds 1.0 µm, a surface roughness reaches a significant level prior to the growth of the second-layer epitaxial film, which increases the height of the bunching step. In consideration of the aforementioned points, it is desirable that the thickness of the first-layer epitaxial film is 0.3 µm or more and 0.8 µm or less.

The result given above is a result obtained when the rate of temperature drop in the time period from the completion of the formation of the first-layer epitaxial film (the time point t2 of FIG. 10) to the start of the formation of the second-layer epitaxial film (the time point t3 of FIG. 10) is set to be 20° C./min. In a case of stopping a growth gas and lowering the temperature in the reactor under the conditions that the growth temperature for the first-layer epitaxial film is higher than the growth temperature for the second-layer epitaxial film, if the rate of the temperature drop is low, a surface roughness may be caused because of hydrogen etching. If the rate of the temperature drop is high, the temperature cannot sufficiently be controlled to cause an undershoot, which temporarily makes the growth temperature lower than required, to consequently increase crystal defects. Therefore, it is desirable to set the rate of the temperature drop to be 5° C./min or more and 30° C./min or less.

The result shown herein is a result obtained when the first-layer and second-layer epitaxial films are caused to grow with a C/Si ratio being fixed for the first-layer epitaxial film and the second-layer epitaxial film. However, the same effects as described above can be obtained also when the epitaxial growth is performed with the C/Si ratio for the formation of the first-layer epitaxial film being different from the C/Si ratio for the formation of the second-layer epitaxial film, for example, with the C/Si ratio for the formation of the second-layer epitaxial film being higher than the C/Si ratio for the formation of the first-layer epitaxial film.

Additionally, the flow rate or the flow rate ratio of the silane ($SiH_4$) gas, the propane ($C_3H_8$) gas, and the nitrogen ($N_2$) gas may be changed during the growth. In one example, the growth rate of the second-layer epitaxial film may be increased as compared with the growth rate of the first-layer epitaxial film.

A high growth temperature increases the efficiency of incorporating nitrogen that is a common n-type dopant for silicon carbide. Here, while the impurity concentration of a SiC substrate is $5 \times 10^{18} cm^{-3}$ to $1 \times 10^{19} cm^{-3}$, the impurity concentration of an epitaxial layer serving as a drift layer is commonly approximately $5 \times 10^{15} cm^{-3}$ to $5 \times 10^{16} cm^{-3}$ depending on the intended use. Thus, an impurity concentration difference of $1 \times 10^2 cm^{-3}$ occurs at the interface between the main surface of the SiC substrate and the epitaxial layer formed thereon. Therefore, in the manufacturing method in which the first-layer epitaxial film is formed on the main surface of the SiC substrate at the growth temperature T1 and then the second-layer epitaxial film is continuously formed thereof at the growth temperature T2 (<T1) to thereby form the n-type drift layer (2+3), there can be expected effect that the first-layer epitaxial film functions as a buffer layer for buffering the impurity concentration difference of $1 \times 10^2 cm^{-3}$.

Although in FIG. 10, the temperature in the reactor is lowered (T1→T2) while the growth gas remains flowed, the flow rate of the growth gas may be reduced in this temperature drop time period.

Figure 14:
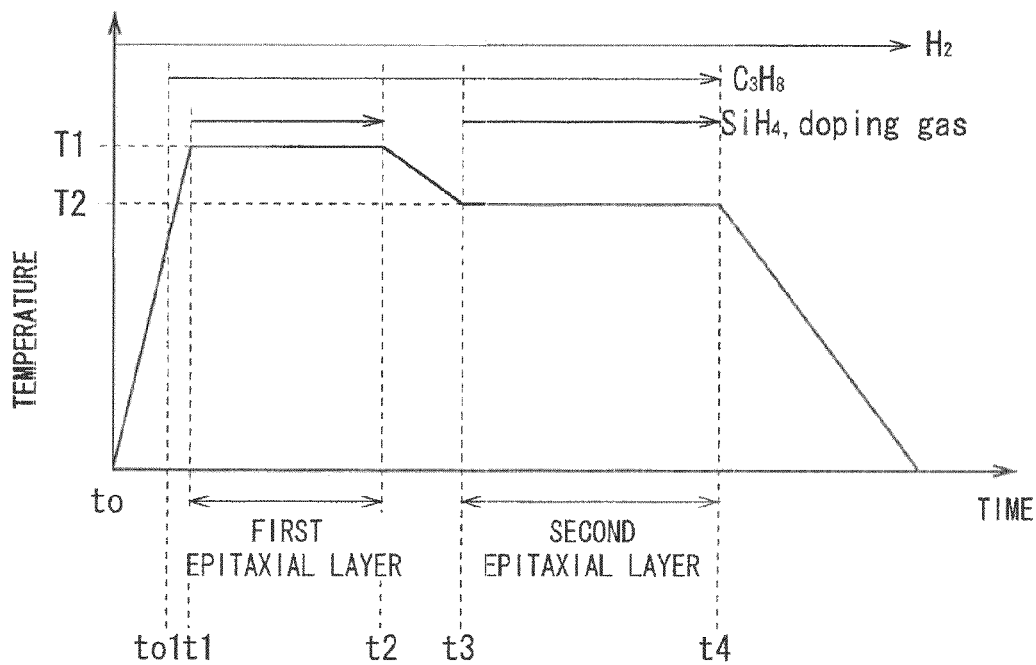
FIG. 14 is a diagram showing a temperature profile in the reactor until the first drift layer and the second drift layer shown in FIG. 1 are prepared.

Moreover, after the completion of the growth of the first drift layer 2, as shown in a temperature profile in the reactor in FIG. 14, the temperature in the reactor may be lowered with the flow-in of the growth being stopped in the temperature drop time period between the time point t2 and the time point t3. Furthermore, for the purpose of reducing desorption of C on the main surface or a surface of the SiC substrate, the propane gas may be flowed into the reactor prior to starting the epitaxial growth of the first drift layer 2 (the time point t01 of FIG. 14). By the same reason as described above, in a time period between the time point t2 at which the growth of the first drift layer 2 is completed and the time point t3 at which the growth of the second drift layer 3 is started, the inflow of the silane gas and the nitrogen gas may be stopped while only the propane gas remains flowed in the reactor.

Here, it is to be noted that the surface roughness of the first-layer epitaxial layer is taken over by the second-layer epitaxial layer formed thereon. Therefore, the growth temperature for the first-layer epitaxial layer is desirably such a temperature that the amount of crystal defects caused by a failure in the migration of reactive species can be small and additionally the height of the bunching step can be relatively small. Moreover, the growth temperature for the second-layer epitaxial layer is desirably such a temperature that the height of the bunching step can be small.

FIG. 18 is a diagram showing a relationship between the growth temperature for the epitaxial layer and the height of the bunching step. FIG. 19 is a diagram showing a relationship between the growth temperature for the epitaxial layer and the density of the crystal defect caused by a migration failure. These results are obtained in an example where the growth film thickness of the epitaxial layer is approximately 2 μm. It is seen from FIGS. 18 and 19 that both the density of the crystal defects caused by a migration failure and the height of the bunching step are reduced when the growth temperature for the epitaxial layer is 1550° C. or higher and 1650° C. or lower. It is also seen that the height of the bunching step is reduced when the growth temperature for the epitaxial layer is 1450° C. or higher and 1550° C. or lower.

Therefore, the growth temperature for the first-layer epitaxial layer is desirably 1550° C. or higher and 1650° C. or lower, and more desirably 1570° C. or higher and 1620° C. or lower. The growth temperature for the second-layer epitaxial layer is desirably 1450° C. or higher and 1550° C. or lower, and more desirably 1470° C. or higher and 1520° C. or lower.

In the example given above, the direction of the off angle of the SiC substrate is a <11-29> direction. However, the above-described effects can be similarly obtained as long as there is a step and a terrace. Therefore, similar effects can be obtained also in a case where the direction of the off angle of the SiC substrate is a <1-100> direction for example, or in a case where the off is formed in another plane of the SiC substrate.

In the example given above, it is assumed that the n-type epitaxial layer is formed on the n-type SiC substrate having an off angle of 5 degrees or less. Here, in any of the cases of (1) forming a p-type epitaxial layer on an n-type SiC substrate, (2) forming a p-type epitaxial layer on a p-type SiC substrate, and (3) forming an n-type epitaxial layer on a p-type SiC substrate, the same effects as described above can be obtained by similarly applying the manufacturing method in which a drift layer including two epitaxial layers is formed under the above-mentioned growth temperature conditions of T1>T2, as long as the SiC substrate is a SiC substrate having an off angle of 5 degrees or less.

Although a silane gas and a propane gas are herein used as the growth gas, the use of another growth gas such as a disilane ($Si_2H_6$) gas, a dichlorosilane ($SiH_2Cl_2$) gas, or a trichlorosilane ($SiHCl_3$) gas, or the use of another hydrocarbon gas can provide the same effects as described above.

As described above, in this embodiment, in forming a drift layer of a semiconductor device by forming an epitaxial layer on a main surface of a SiC substrate having an off angle of 5 degrees, the density of crystal defects caused by a failure in the migration of reactive species can be reduced, and additionally the height of a bunching step can be suppressed to a relatively low value. Moreover, since the growth temperature for the second-layer epitaxial layer is lower than the growth temperature for the first-layer epitaxial layer, the thermal uniformity is improved, and the in-plane distribution of the epitaxial layer thickness and the carrier concentration can be improved. Furthermore, the margin of the epitaxial growth between wafers or between lots can be increased.

The adoption of the drift layers 2 and 3 manufactured by the manufacturing method according to this embodiment can suppress occurrence of carrier scattering at a channel part of the SiC semiconductor device.

(Embodiment 2)

Figure 15:
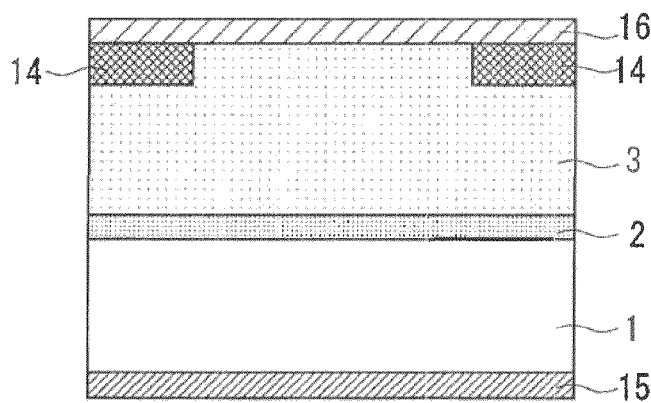
FIG. 15 is a vertical cross-sectional view showing a structure of a SiC Schottky diode that includes a SiC substrate having an off angle of 5 degrees or less, the SiC Schottky diode being prepared by a manufacturing method according to an embodiment 2.

FIG. 15 is a vertical cross-sectional view showing a structure of a SiC Schottky diode (hereinafter referred to as "SIC-SBD") according to this embodiment. In the following, a method for manufacturing the SiC-SBD shown in FIG. 15 will be described.

Firstly, at a growth temperature T1, an n-type first epitaxial layer 2 is caused to epitaxially grow on and in contact with a main surface or a surface of an n-type (first conductivity type) substrate 1 made of SiC and having an off angle of 5 degrees or less (for example, the off angle is set to 4 degrees). Then, at a growth temperature T2 (see FIG. 10 or FIG. 14) lower than the growth temperature T1 for the first epitaxial layer 2, an n-type second epitaxial layer 3 is caused to epitaxially grow on and in contact with an upper surface of the first epitaxial layer 2. Then, a surface of the layer 3 is exposed to a sacrificial oxidation.

Then, for the preparation of a terminal structure 14 for improving a pressure resistance, a photoresist patterning mask (not shown) having a desired pattern is formed on a surface of the n-type second epitaxial layer 3. Then, impurity ion is implanted through the mask, so that an ion-implanted layer that finally serves as the terminal structure 14 is formed in the n-type second epitaxial layer 3. Then, the mask and the sacrificial oxidation film is removed.

Subsequently, an activation annealing process is performed for activating the implanted impurity atoms, thereby forming the terminal structure 14 of p-type (second conductivity type).

Finally, an ohmic electrode 15 is formed in ohmic contact with a back surface of the SiC substrate, and a Schottky electrode 16 is formed in Schottky contact with a substrate surface defined by the surface of the second epitaxial layer 3 and a surface of the terminal structure 14.

Through the above-described manufacturing steps, the SiC-SBD including the epitaxial layer (2+3) is completed in which, similarly to the vertical SiC-MOSFET according to the embodiment 1, the height of a bunching step can be suppressed to a low value and the density of crystal defects caused by a failure in the migration of materials can be reduced.

(Embodiment 3)

Figure 16:
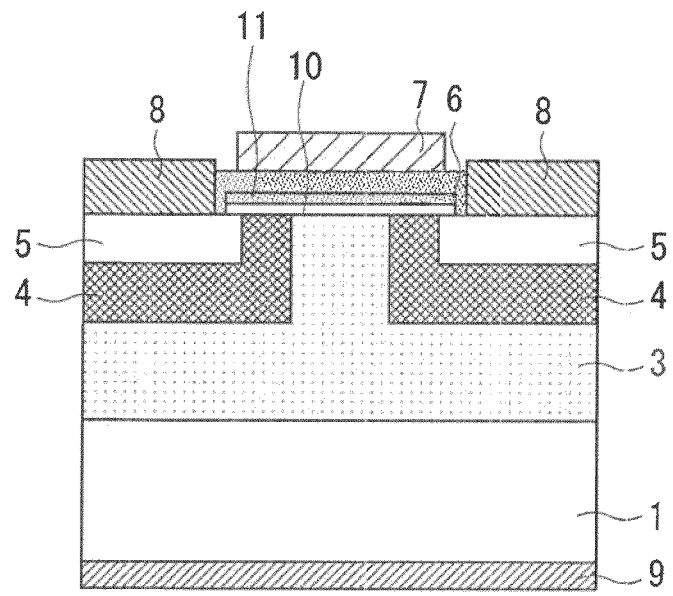
FIG. 16 is a vertical cross-sectional view showing a structure of a SiC-MOSFET that includes a SiC substrate having an off angle of 5 degrees or less, the SiC-MOSFET being prepared by a manufacturing method according to an embodiment 3.

FIG. 16 is a vertical cross-sectional view showing a structure of a SiC-MOSFET that includes a SiC substrate having an off angle of 5 degrees or less, the SiC-MOSFET being manufactured by a manufacturing method according to this embodiment. The structure of the SiC-MOSFET of FIG. 16 is different from the structure of the SiC-MOSFET of FIG. 1, in that a drift layer has a single layer of the epitaxial layer 3 and that two n-type layers of first and second epitaxial layers 10 and 11 are arranged on a portion of the surface of the p-type base region 4 where the source region 5 is not formed and on a surface of a portion of the drift layer 3 interposed between opposed surfaces of the pair of base regions 4. In FIG. 16, the first and second epitaxial layers 10 and 11 form a channel part of the SiC-MOSFET.

An object of this embodiment is to propose a manufacturing method that allows the suppression of the height of a bunching step in the first and second epitaxial layers 10 and 11 on the surface of the drift layer 3, and also allows the reduction in the density of a defect lattice originating from an interface between epitaxial layers. In the following, a manufacturing method according to this embodiment will be described with reference to FIG. 16.

In FIG. 16, process steps performed until the n-type source region 5 is formed through an activation annealing process for activating the ion implanted in the p-type base region 4 within the drift layer 3 are, except the step for forming the first drift layer 2, the same as the process steps already described in the embodiment 1. Furthermore, after the activation of the implanted ion, a sacrificial oxidation is performed to form the n-type first epitaxial layer 10, and then the n-type second epitaxial layer 11 is caused to epitaxially grow immediately on and in contact with the first epitaxial layer 10 at a growth temperature lower than the growth temperature for the first epitaxial layer 10.

Then, a resist mask (not shown) is formed on the first and second epitaxial layers 10 and 11, and portions of the first and the second epitaxial layers 10 and 11 except portions thereof serving as a channel are removed. As a result, the channel part is patterned to be configured such that a pair of the base regions 4 and the source regions 5 can be positioned below both end portions of the channel part and a portion of the drift layer 3 interposed between the base regions 4 opposed to each other can be positioned immediately under the center of the channel part.

Then, the gate insulating film 6 is formed through thermal oxidation or deposition. A film of the gate electrode 7 is formed on the gate insulating film 6 and then patterned. The gate electrode 7 is patterned into such a shape that the pair of base regions 4 and the pair of source regions 5 can be positioned below both end portions of the electrode 7 and a part of the drift layer 3 positioned between the base regions 4 opposed to each other can be positioned immediately under the center of the electrode 7.

Furthermore, a portion of the gate insulating film 6 left on each source region 5 is removed by a photolithography technique and an etching technique. After the removal, a film of the source electrode 8 is formed on an exposed portion of the source region 5, and patterned. Then, the drain electrode 9 is formed on the back surface of the SiC substrate 1. Through these process steps, the main part of the element structure as shown in FIG. 16 is completed.

In this embodiment, the first and second epitaxial layers 10 and 11 are caused to epitaxially grow on the upper surface of the drift layer 3 under the condition of (the growth temperature T1 for the first epitaxial layer 10)>(the growth temperature T2 for the second epitaxial layer 11). This can provide the advantages of (1) reducing the density of the lattice defect originating from an interface between the first epitaxial layer 10 and the drift layer 3 that is an epitaxial layer and (2) suppressing the height of a bunching step in the second epitaxial layer 11.

Instead of the drift layer 3 of this embodiment, the first and second drift layers 2 and 3 already described in the embodiment 1 may be applied in this embodiment. In this case, the above-described effects of the embodiment 1 can be obtained in a synergistic manner.

(Embodiment 4)

Figure 17:
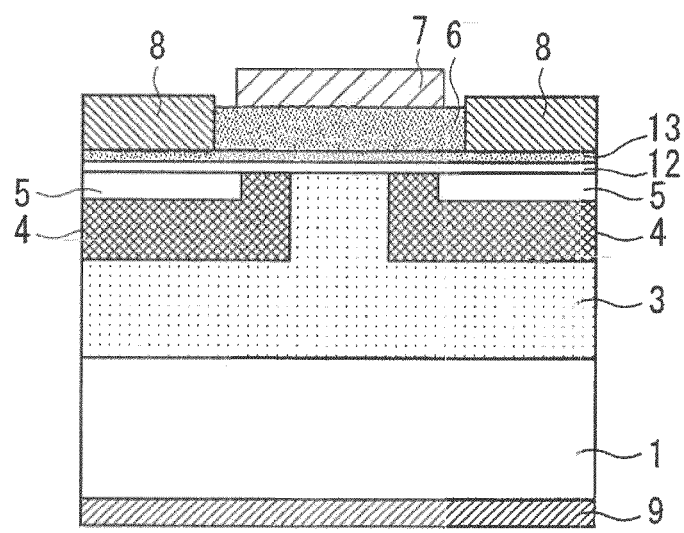
FIG. 17 is a vertical cross-sectional view showing a structure of a SiC-MOSFET that includes a SiC substrate having an off angle of 5 degrees or less, the SiC-MOSFET being prepared by a manufacturing method according to an embodiment 4.

FIG. 17 is a vertical cross-sectional view showing a structure of a SiC-MOSFET that includes a SiC substrate having an off angle of 5 degrees or less, the SiC-MOSFET being manufactured by a manufacturing method according to this embodiment. In the SiC-MOSFET shown in FIG. 17, two n-type first and second epitaxial layers 12 and 13 having a different carrier concentration from that of the drift layer 3 is caused to grow on the drift layer 3, and these n-type first and second epitaxial layers 12 and 13 form a channel part of the SiC-MOSFET. An object of this embodiment is to propose a manufacturing method that allows the suppression of the height of a bunching step in the first and second epitaxial layers 12 and 13 on the surface of the drift layer 3, and also allows the reduction in the density of a defect lattice originating from an interface between epitaxial layers.

The drift layer 3 is caused to epitaxially grow on the SiC substrate 1 having an off angle of 5 degrees or less, and then the n-type first epitaxial layer 12 having a different carrier concentration from that of the drift layer 3 is caused to epitaxially grow at the growth temperature T1. Additionally, an epitaxial growth is performed at the growth temperature T2 lower than the growth temperature T1 for the first epitaxial layer 12 to thereby form the second epitaxial layer 13 on and in contact with the upper surface of the first epitaxial layer 12. Then, through the same process steps as those performed after the formation of the drift layer of the embodiment 1, a main part of the element structure as shown in FIG. 17 is completed.

In this embodiment, the first and second epitaxial layers 12 and 13 are caused to epitaxially grow on the upper surface of the drift layer 3 under the condition of (the growth temperature T1 for the first epitaxial layer 12)>(the growth temperature T2 for the second epitaxial layer 13). This can provide the advantages of (1) reducing the density of the lattice defect originating from an interface between the first epitaxial layer 12 and the drift layer 3 that is an epitaxial layer and (2) suppressing the height of a bunching step in the second epitaxial layer 13.

Instead of the drift layer 3 of this embodiment, the first and second drift layers 2 and 3 already described in the embodiment 1 may be applied in this embodiment. In this case, the above-described effects of the embodiment 1 can be obtained in a synergistic manner.

While the invention has been described in detail, the foregoing description is in all aspects illustrative and the present invention is not limited thereto. It will be appreciated that numerous modifications unillustrated herein can be made without departing from the scope of the present invention.

DESCRIPTION OF THE REFERENCE NUMERALS

1 n-type (corresponding to a first conductivity type) SiC substrate; 2 first drift layer made of n-type SiC; 3 second drift layer made of n-type SiC and formed by epitaxial growth at growth temperature lower than growth temperature for first drift layer; 4 base region of p-type (corresponding to second conductivity type); 5 n-type source region; 6 gate insulating film; 7 gate electrode; 8 source electrode; 9 drain electrode; 10 first epitaxial layer made of n-type SiC; 11 second epitaxial layer made of n-type SiC and formed by epitaxial growth at growth temperature lower than growth temperature for first epitaxial layer; 12 first epitaxial layer made of n-type SiC; 13 second epitaxial layer made of n-type SiC and formed by epitaxial growth at growth temperature lower than growth temperature for first epitaxial layer; 14 terminal structure; 15 ohmic electrode; and 16 Schottky electrode.

The invention claimed is:

1. A method for manufacturing a silicon carbide semiconductor device, said method comprising:
    a first growth step of causing a first epitaxial layer to grow on a main surface of a silicon carbide semiconductor substrate having an off angle; and
    a second growth step of causing a second epitaxial layer to grow on and in contact with an upper surface of said first epitaxial layer at a growth temperature lower than a growth temperature for said first epitaxial layer,
    wherein, in said first and second growth steps, a gas containing a silicon atom and a gas containing a carbon atom are used as a growth gas.

2. The method for manufacturing a silicon carbide semiconductor device according to claim 1, wherein
    said gas containing a silicon atom is any one of a silane gas, a disilane gas, and a dichlorosilane gas,
    said gas containing a carbon atom is a hydrocarbon gas.

3. The method for manufacturing a silicon carbide semiconductor device according to claim 1, wherein
    said off angle of said silicon carbide semiconductor substrate is 5 degrees or less.

4. The method for manufacturing a silicon carbide semiconductor device according to claim 1, wherein
    said first epitaxial layer epitaxially grows while being in contact with said main surface of said silicon carbide semiconductor substrate.

5. The method for manufacturing a silicon carbide semiconductor device according to claim 1, wherein
    the thickness of said first epitaxial layer is 0.3 μm or more.

6. The method for manufacturing a silicon carbide semiconductor device according to claim 1, wherein
    the growth temperature for said first epitaxial layer is 1570° C. or higher and 1620° C. or lower.

7. The method for manufacturing a silicon carbide semiconductor device according to claim 1, wherein
    the growth temperature for said second epitaxial layer is 1470° C. or higher and 1520° C. or lower.

8. The method for manufacturing a silicon carbide semiconductor device according to claim 1, wherein
    a difference between the growth temperature for said first epitaxial layer and the growth temperature for said second epitaxial layer is 50° C. or more and 150° C. or less.

* * * * *